(12) United States Patent
Chowdhury et al.

(10) Patent No.: US 12,216,915 B2
(45) Date of Patent: Feb. 4, 2025

(54) ADAPTIVE READ DISTURB SCAN

(71) Applicant: Micron Technology, Inc., Boise, ID (US)

(72) Inventors: Animesh R. Chowdhury, Boise, ID (US); Kishore K. Muchherla, San Jose, CA (US); Nicola Ciocchini, Boise, ID (US); Akira Goda, Setagaya (JP); Jung Sheng Hoei, Newark, CA (US); Niccolo' Righetti, Boise, ID (US); Jonathan S. Parry, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 17/967,265

(22) Filed: Oct. 17, 2022

(65) Prior Publication Data

US 2024/0126448 A1    Apr. 18, 2024

(51) Int. Cl.
*G06F 3/06* (2006.01)

(52) U.S. Cl.
CPC .......... *G06F 3/0619* (2013.01); *G06F 3/0653* (2013.01); *G06F 3/0679* (2013.01)

(58) Field of Classification Search
CPC ...... G06F 3/061; G06F 3/0619; G06F 3/0653; G06F 3/0659; G06F 3/0679; G11C 16/26; G11C 16/32; G11C 16/3418; G11C 16/349; G11C 29/08; G11C 29/10; G11C 29/4401; G11C 29/52
See application file for complete search history.

(56) References Cited

U.S. PATENT DOCUMENTS

| | | | |
|---|---|---|---|
| 8,825,976 B1 * | 9/2014 | Jones | G06F 12/0246 711/2 |
| 9,053,808 B2 | 6/2015 | Sprouse et al. | |
| 9,645,751 B2 | 5/2017 | Ryan et al. | |
| 10,755,793 B2 | 8/2020 | Singidi et al. | |
| 10,818,361 B2 | 10/2020 | Malshe et al. | |
| 11,379,304 B1 * | 7/2022 | Cadloni | G06F 12/0882 |
| 2010/0082884 A1 | 4/2010 | Chen et al. | |
| 2014/0173239 A1 * | 6/2014 | Schushan | G11C 16/3427 365/185.02 |
| 2022/0044744 A1 * | 2/2022 | Wang | G11C 16/08 |
| 2022/0139481 A1 * | 5/2022 | Rayaprolu | G06F 11/3037 365/185.09 |
| 2022/0308778 A1 * | 9/2022 | Shukla | G06F 3/064 |
| 2023/0195354 A1 * | 6/2023 | Liu | G06F 11/3409 |
| 2023/0238075 A1 * | 7/2023 | Aiouaz | G11C 16/0483 714/721 |

* cited by examiner

*Primary Examiner* — Aracelis Ruiz

(74) *Attorney, Agent, or Firm* — Brooks, Cameron & Huebsch, PLLC

(57) ABSTRACT

Apparatuses, systems, and methods for adapting a read disturb scan. One example method can include determining a delay between a first read command and a second read command, incrementing a read count based on the determined delay between the first read command and the second read command, and adapting a read disturb scan rate based on the incremented read count.

19 Claims, 4 Drawing Sheets

ADAPTIVE READ DISTURB SCAN

TECHNICAL FIELD

The present disclosure relates generally to memory devices, and more particularly, to apparatuses, methods, and systems for adapting a read disturb scan.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others. A memory device can be included on a printed circuit board assembly (PCBA).

DETAILED DESCRIPTION

Figure 1:
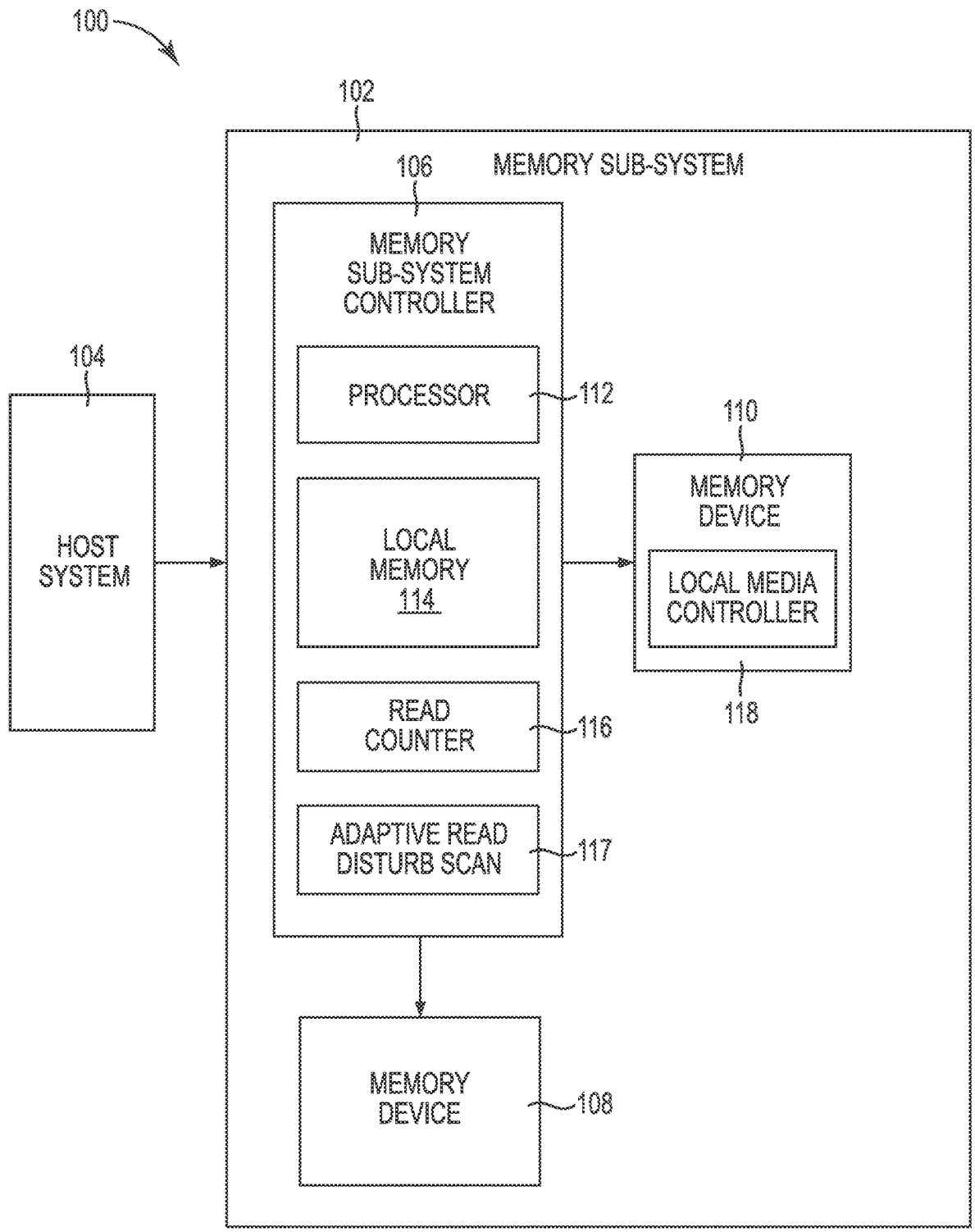
FIG. 1 illustrates an example computing system that includes a memory sub-system in accordance with some embodiments of the present disclosure.

Apparatuses, systems, and methods for adapting a read disturb scan are provided herein. In a number of embodiments of the present disclosure, a method can include determining a delay between a first read command and a second read command, incrementing a read count based on the determined delay between the first read command and the second read command, and adapting a read disturb scan rate based on the incremented read count.

Reading data from a word line can cause read disturb on remaining word lines of a memory block. Read disturb can linger on a memory block even after a read command is completed due to latent read disturb. If read commands are issued back-to-back to the same memory block, the latent read disturb stress per read can be reduced. If read commands are issued to the same memory block with a delay in between, the latent read disturb stress per read can be increased.

The memory device can track read counts. Read counts can be tracked at a block level, word line level, a super block level, and/or a logic unit (LUN) level to manage read disturb. When a read count exceeds a threshold, a read disturb scan can be triggered by the memory device.

Presently, a memory device can have a specification that limits the number of reads on a block for uniform read stress and/or single word line read stress prior to a read disturb scan being performed. A user of the memory device can issue reads to a block at their own discretion, which can make read-to-read delay unpredictable. Accordingly, some amount of finite delay between read commands is assumed by the memory device manufacturer to guarantee a read disturb specification to its customers.

Memory devices can store sequential and random data. Read commands for random data can trigger reads on different memory blocks and/or larger delays in between several read operations within the same memory block, which can increase latent read stress. While read commands for sequential data can trigger back-to-back reads within the same memory block or sequential memory blocks and/or shorter delays between several read operations, which can decrease latent read stress.

In a number of embodiments of the present disclosure, the memory device can pre-determine read commands based on a command que, look-ahead reads, and/or sequential read workload detection and then predict a rate of reads issued to a block to estimate latent read stress per read command. Accordingly, the memory device can update the read counter based on the estimated latent read stress per read command, a data pattern, and a footprint of customer reads to prevent unnecessary read disturb scans.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of dampers can refer to one or more dampers. Additionally, designators such as "V", "W", "X", "Y", and "Z", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 illustrates an example computing system 100 that includes a memory sub-system 102 in accordance with some embodiments of the present disclosure. Aspects of the present disclosure are directed to memory sub-system 102 performing adaptive read disturb scans, in particular to memory sub-systems 102 that include a storage device, a memory module, or a combination of such. An example of a memory sub-system 102 is a storage system such as a solid-state drive (SSD). Examples of storage devices and memory modules are described below in conjunction with FIG. 1.

In general, a host system (e.g., host) 104 can utilize a memory sub-system 102 that includes one or more components, such as memory devices 110 that store data. The host system 104 can provide data to be stored at the memory sub-system 102 and can request data to be retrieved from the memory sub-system 102.

A memory device 110 can be a non-volatile memory device. One example of a non-volatile memory device is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device 110 used to store data and can include a group of memory cells, a word line group, a word line, or individual memory cells. For some memory devices 110, blocks (also hereinafter referred to as "memory blocks") are the smallest area that can be erased. Pages cannot be erased individually, and only whole blocks can be erased.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Each of the memory devices 108, 110 can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Read disturb scans can be performed on memory device 110 to determine when a memory block needs to be retired to prevent unreliable memory blocks from losing data. However, a memory device 110 can have a specification that requires a read disturb scan rate that may be unnecessary for a block that has less stress than other blocks due to experiencing less latent read disturb than other blocks. Read disturb scans can take time and resources from the memory sub-system 102. For example, data can be unavailable when the memory device 110 is performing a read disturb scan. As such, frequent read disturb scans can reduce the performance and/or quality of service due to latency of the memory device 110.

Aspects of the present disclosure address the above and other deficiencies using the adaptive read disturb scan component 117. Embodiments of the present disclosure provide that the adaptive read disturb scan component 117 can pre-determine read commands to predict a rate reads are issued to a block to estimate an amount of latent read disturb per read command, which can be used to increment the read count per block.

FIG. 1 illustrates an example computing system 100 that includes the memory sub-system 102 in accordance with some embodiments of the present disclosure. The memory sub-system 102 can include media, such as one or more volatile memory devices (e.g., memory device 108), one or more non-volatile memory devices (e.g., memory device 110), or a combination of such.

A memory sub-system 102 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 104 that is coupled to one or more memory sub-systems 102. In some embodiments, the host system 104 is coupled to different types of memory sub-system 102. FIG. 1 illustrates one example of a host system 104 coupled to one memory sub-system 102. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 104 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 104 uses the memory sub-system 102, for example, to write data to the memory sub-system 102 and read data from the memory sub-system 102.

The host system 104 can be coupled to the memory sub-system 102 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 104 and the memory sub-system 102. The host system 104 can further utilize an NVM Express (NVMe) interface to access components (e.g., memory devices 110) when the memory sub-system 102 is coupled with the host system 104 by the PCIe interface.

The physical host interface can provide an interface for passing control, address, data, and other signals between the memory sub-system 102 and the host system 104. FIG. 1 illustrates a memory sub-system 102 as an example. In general, the host system 104 can access multiple memory sub-systems via the same communication connection, multiple separate communication connections, and/or a combination of communication connections.

The memory devices 108, 110 can include any combination of the different types of non-volatile memory devices and/or volatile memory devices. The volatile memory devices (e.g., memory device 108) can be, but are not limited to, random access memory (RAM), such as dynamic random-access memory (DRAM) and synchronous dynamic random access memory (SDRAM).

Some examples of non-volatile memory devices (e.g., memory device 110) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory components such as three-dimensional cross-point arrays of non-volatile memory cells and NAND type memory (e.g., 2D NAND, 3D NAND) are described, the memory device 110 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 106 (or controller 106 for simplicity) can communicate with the memory devices 108, 110 to perform operations such as reading data, writing data, or erasing data at the memory devices 108, 110 and other such operations. The memory sub-system controller 106 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 106 can be a microcontroller, special purpose logic circuitry (e.g., a field programmable gate array (FPGA), an application specific integrated circuit (ASIC), etc.), or other suitable processor.

The memory sub-system controller 106 can include a processor 112 (e.g., a processing device) configured to execute instructions stored in a local memory 114. In the illustrated example, the local memory 114 of the memory sub-system controller 106 includes an embedded memory configured to store instructions for performing various processes, operations, logic flows, and routines that control operation of the memory sub-system 102, including handling communications between the memory sub-system 102 and the host system 104.

In some embodiments, the local memory 114 can include memory registers storing memory pointers, fetched data, etc. The local memory 114 can also include read-only memory (ROM) for storing micro-code. While the example memory sub-system 102 in FIG. 1 has been illustrated as including the memory sub-system controller 106, in another embodiment of the present disclosure, a memory sub-system 102 does not include a memory sub-system controller 106, and can instead rely upon external control (e.g., provided by an external host, or by a processor or controller separate from the memory sub-system).

In general, the memory sub-system controller 106 can receive commands or operations from the host system 104 and can convert the commands or operations into instructions or appropriate commands to achieve the desired access to the memory device 110 and/or the memory device 108. The memory sub-system controller 106 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 108, 110. The memory sub-system controller 106 can further include host interface circuitry to communicate with the host system 104 via the physical host interface. The host interface circuitry can convert the commands received from the host system 104 into command instructions to access the memory device 110 and/or the memory device 108 as well as convert responses associated with the memory device 110 and/or the memory device 108 into information for the host system 104.

The memory sub-system 102 can also include additional circuitry or components that are not illustrated. In some embodiments, the memory sub-system 102 can include a cache or buffer (e.g., DRAM) and address circuitry (e.g., a row decoder and a column decoder) that can receive an address from the memory sub-system controller 106 and decode the address to access the memory device 110 and/or the memory device 108.

In some embodiments, the memory device 110 includes local media controllers 118 that operate in conjunction with memory sub-system controller 106 to execute operations on one or more memory cells of the memory device 110. An external controller (e.g., memory sub-system controller 106) can externally manage the memory device 110 (e.g., perform media management operations on the memory device 110). In some embodiments, a memory device 110 is a managed memory device, which is a raw memory device combined with a local controller (e.g., local memory controller 118) for media management within the same memory device package. An example of a managed memory device is a managed NAND (MNAND) device.

The memory sub-system 102 can include a read counter 116 and/or an adaptive read disturb scan component 117. Although not shown in FIG. 1 to not obfuscate the drawings, the read counter 116 and/or the adaptive read disturb scan component 117 can include various circuitry to facilitate incrementing a read count. In some embodiments, the read counter 116 and/or the adaptive read disturb scan component 117 can include special purpose circuitry in the form of an ASIC, FPGA, state machine, and/or other logic circuitry that can allow the read counter 116 to orchestrate and/or perform operations to update the read count based on the estimated latent read stress and/or allow the adaptive read disturb scan component 117 to orchestrate and/or perform operations to increase or decrease the frequency of the read disturb scan based on an incremented read count for the memory device 110 and/or the memory device 108.

In some embodiments, the memory sub-system controller 106 includes at least a portion of the read counter 116 and/or the adaptive read disturb scan component 117. For example, the memory sub-system controller 106 can include a processor 112 configured to execute instructions stored in local memory 114 for performing the operations described herein. In some embodiments, the read counter 116 and/or the adaptive read disturb scan component 117 is part of the host system 104, an application, or an operating system.

In a non-limiting example, an apparatus (e.g., the computing system 100) can include a memory sub-system read counter 116 and/or adaptive read disturb scan component 117. The memory sub-system read counter 116 and/or the adaptive read disturb scan 117 can be resident on the memory sub-system 102. As used herein, the term "resident on" refers to something that is physically located on a particular component. For example, the memory sub-system adaptive read disturb scan component 117 being "resident on" the memory sub-system 102 refers to a condition in which the hardware circuitry that comprises the memory sub-system adaptive read disturb scan component 117 is physically located on the memory sub-system 102. The term "resident on" can be used interchangeably with other terms such as "deployed on" or "located on," herein.

The memory sub-system adaptive read disturb scan component 117 can be configured to determine a delay between a first read command and a second read command, increment a read count based on the determined delay between the first read command and the second read command, and adapt a read disturb scan rate based on the incremented read count.

Figure 2:
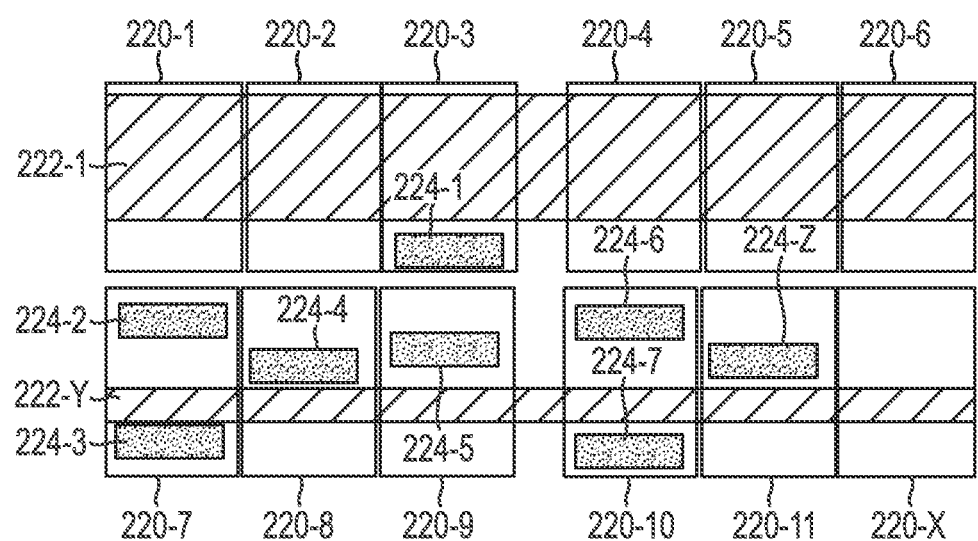
FIG. 2 is a block diagram of a number of memory blocks including sequential data and random data in accordance with a number of embodiments of the present disclosure.

FIG. 2 is a block diagram of a number of memory blocks 220-1, ..., 220-X including sequential data 222-1, ..., 222-Y and random data 224-1, ..., 224-Z in accordance with a number of embodiments of the present disclosure. Read commands for random data 224-1, ..., 224-Z can trigger reads on different blocks of the number of memory blocks 220-1, ..., 220-X. For example, random data 224-1 is located on block 220-3, random data 224-2 is located on block 220-7, random data 224-4 is located on block 220-8, random data 224-5 is located on block 220-9, random data 224-6 is located on block 220-10, and random data 224-Z is located on block 220-11. Executing a series of read commands where each of the read commands in the series of read commands read data from different blocks of the number of memory blocks 220-1, ..., 220-X can increase latent read stress.

Read commands for random data 224-1, ..., 224-Z can trigger larger delays in between several read operations within the same block of the number of memory blocks 220-1, ..., 220-X. For example, block 220-7 includes random data 224-2, sequential data 222-Y, and random data 224-3 and block 220-10 includes random data 224-6, sequential data 222-Y, and random data 224-7. Executing several read commands for random data on the same block of the number of memory blocks 220-1, ..., 220-X after a particular period of time has passed between the several read commands can increase latent read stress.

Read commands for sequential data 222-1, ..., 222-Y can trigger back-to-back reads within the same memory block of the number of memory blocks 220-1, ..., 220-X. For example, blocks 220-1, 220-2, 220-3, 220-4, 220-5, and 220-6 each have back-to-back reads, as illustrated by the bigger boxes of sequential data 220-1, 220-2, 220-3, 220-4, 220-5, and 220-6 that take up the majority of blocks 220-1, 220-2, 220-3, 220-4, 220-5, and 220-6. Executing back-to-back reads within the same memory block can decrease latent read stress.

Read commands for sequential data 222-1, ..., 222-Y can trigger sequential memory blocks and/or shorter delays between several read operations. For example, blocks 220-1, 220-2, 220-3, 220-4, 220-5, and 220-6 have sequential data 222-1 and blocks 220-7, 220-8, 220-9, 220-10, 220-11, and 220-X have sequential data 222-Y. Sequential memory blocks of the number of memory blocks 220-1, ..., 220-X and/or shorter delays between several read operations can decrease latent read stress.

Figure 3:
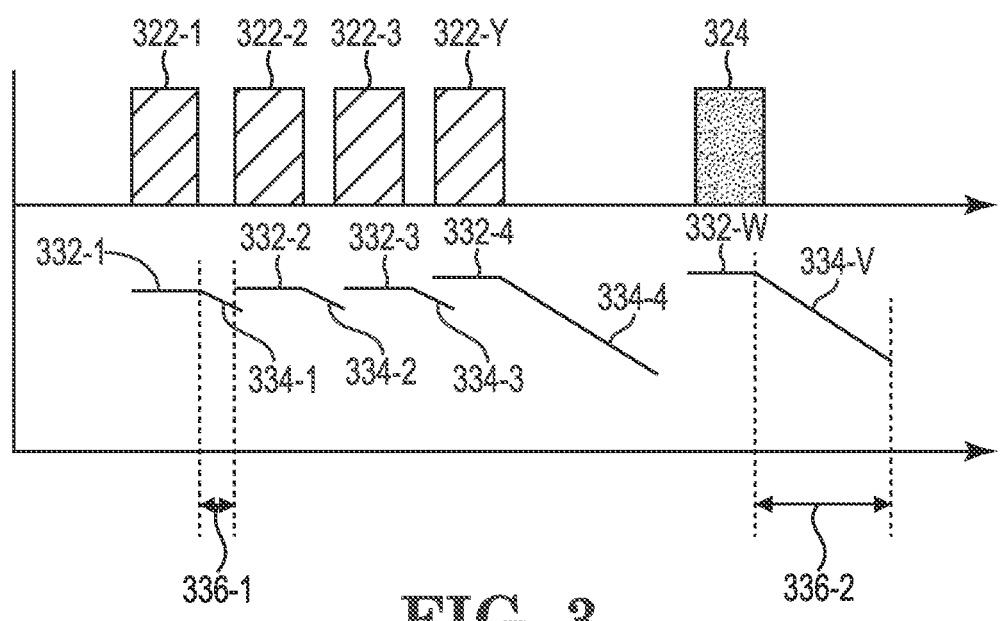
FIG. 3 is a graph of latent read stress experienced by each memory block read over time in accordance with a number of embodiments of the present disclosure.

FIG. 3 is a graph of latent read stress experienced by each block read over time in accordance with a number of embodiments of the present disclosure. The graph includes sequential data 322-1, ..., 322-Y corresponding to sequential data 222-1, ..., 222-Y in FIG. 2 and random data 324 corresponding to random data 224 in FIG. 2. Each bar of sequential data 322-1, ..., 322-Y and random data 324 can represent a memory block (e.g., memory block 220 in FIG. 2).

Below each bar of sequential data 322-1, ..., 322-Y and random data 324 there is a corresponding read voltage profile. The read voltage profile for each bar of sequential data 322-1, ..., 322-Y and random data 324 can indicate read stress 332-1, ..., 332-W and latent read stress 334-1, ..., 334-V over time in milliseconds, for example. Read stress 332-1, ..., 332-W can be the wear each memory block is experiencing during the execution of a read and latent read stress 334-1, ..., 334-V can be the wear each memory block experiences after the execution of a read.

A memory sub-system (e.g., memory sub-system 102 in FIG. 1) can pre-determine read commands based on a command que, look-ahead reads, and/or sequential read workload detection. For example, firmware of the memory sub-system has a list of read commands and their physical addresses in response to receiving read commands from a host system (e.g., host system 104 in FIG. 1). The list of read commands can be generated using commands in queue depth to determine a number of sequential reads or a sequential read with a large transfer size or the list of read commands can be generated using look-ahead reads based on sequential pattern detection.

In a number of embodiments, the counter can be block based. If a read command in a block address, for example, a first page of a block, is succeeded by another read command in the same block address within a period of time, the read count can be incremented at a smaller value because it is a sequential read. Accordingly, the read disturb scan rate can be decreased. If a read command in a block address is not succeeded by another read command in the same block within the period of time, the read count can be incremented at a default value. Accordingly, the read disturb scan rate can be increased.

In some examples, time period 336-1 can be compared to the particular period of time. Time period 336-1 can be 1 millisecond and the particular period of time can be 2 milliseconds, for example. Accordingly, sequential data 322-1 is succeeded by sequential data 322-2 within the particular period of time. Sequential data 322-2 can also be succeeded by sequential data 322-3 within the particular period of time and sequential data 322-3 can be succeeded by sequential data 322-Y within the particular period of time. Accordingly, the latent read stresses 334-1, 334-2, and 334-3 are less than the latent read stresses 334-4 and 334-V of sequential data 322-Y and random data 324, which are not succeeded by another read command within the particular period of time. For example, time period 336-2 can be 3 milliseconds, which exceeds the particular period of time of 2 milliseconds. As such, the number of blocks including sequential data 322-1, 322-2, and 322-3 can have a read count that is incremented at a smaller value than the number of blocks including sequential data 322-Y and random data 324. For example, the number of blocks including sequential data 322-1, 322-2, and 322-3 can have a read count that is incremented by 3 and the number of blocks including sequential data 322-Y and random data 324 can have a read count that is incremented by 5. The read disturb scan can be triggered once a read count reaches 100, for example. Therefore, the number of blocks including sequential data 322-1, 322-2, and 322-3 can have a lower read disturb scan rate than the number of blocks including sequential data 322-Y and random data 324.

Figure 4:
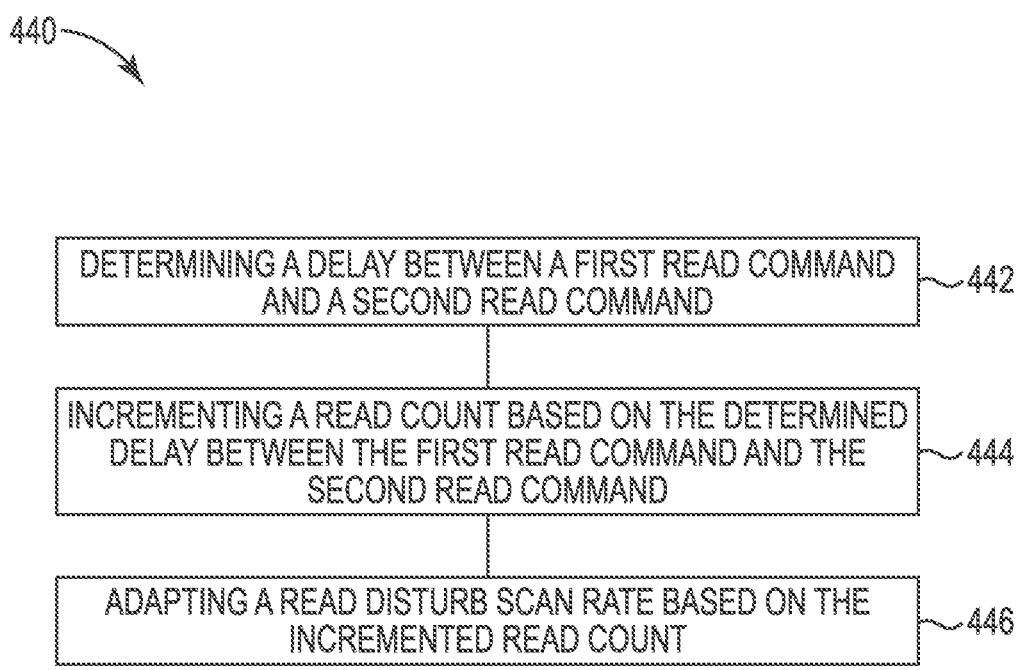
FIG. 4 is a flow diagram of a method for adapting a read disturb scan in accordance with a number of embodiments of the present disclosure.

FIG. 4 is a flow diagram of a method 440 for adapting a read disturb scan in accordance with a number of embodiments of the present disclosure. At block 442, the method 440 can include determining a delay between a first read command and a second read command. The delay between the first read command and the second read command can be determined by a processor (e.g., processor 112 in FIG. 1) based on a command queue depth. The command queue depth can be based on a transfer size. A number of physical addresses associated with a number of commands in the command queue can be used to determine the transfer size.

In some examples, the command queue depth can be based on a number of sequential read commands. The number of sequential read commands can be based on a physical address of the first read command and a physical address of the second read command. A host system (e.g., host system 104 in FIG. 1) can transmit a command to a memory sub-system (e.g., memory sub-system 102 in FIG. 1) and/or a memory device (e.g., memory device 110 in FIG. 1) including the number of sequential read commands. The number of sequential read commands can be for a first file. The first file can be a media file, for example.

In a number of embodiments, the delay between the first read command and the second read command can be based on a look-ahead read. The look-ahead read can be based on sequential pattern detection.

At block 444, the method 440 can include incrementing a read count based on the determined delay between the first read command and the second read command. The read count can be recorded by a read counter (e.g., read counter 116 in FIG. 1). In some examples, the processor can be configured to increment the read count.

The read count can be incremented by a first value in response to determining that the first read command in a block address is succeeded by the second read command in the block address within a particular period of time. In a number of embodiments, the read count can be incremented by a first value in response to receiving a number of sequential read commands.

The read count can be incremented by a second value in response to determining that the first read command in the block address is succeeded by the second read command in the block address after the particular period of time. In a number of embodiments, the read count can be incremented by a second value in response to receiving a random read command. The host system can transmit a command to the memory device including the random read command. The random read command can be a second file, where the size of the second file is less than the size of the first file. In some examples, the first value can be less than the second value.

In a number of embodiments, the read count can be incremented by a third value. For example, if the first read command in the block address is succeeded by a program command in the block address within the particular period of time, the read count can be incremented by a third value. The third value can be less than the second value.

At block 446, the method 440 can include adapting a read disturb scan rate based on the incremented read count. The method 440 can further include initiating a read disturb scan in response to the incremented read count reaching a threshold. In some examples, the processor can adapt the read disturb scan rate and/or initiate the read disturb scan.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   determining a delay between a first read command and a second read command;
   incrementing a read count based on the determined delay between the first read command and the second read command; and
   adapting a read disturb scan rate based on the incremented read count.

2. The method of claim 1, further comprising determining the delay between the first read command and the second read command based on a command queue depth.

3. The method of claim 2, further comprising determining the command queue depth based on a transfer size.

4. The method of claim 3, further comprising determining the transfer size based on a number of physical addresses associated with a number of commands in the command queue.

5. The method of claim 2, further comprising determining the command queue depth based on a number of sequential read commands.

6. The method of claim 5, further comprising determining the number of sequential read commands based on a physical address of the first read command and a physical address of the second read command.

7. The method of claim 1, further comprising determining the delay between the first read command and the second read command based on a look-ahead read.

8. The method of claim 7, further comprising performing the look-ahead read based on sequential pattern detection.

9. An apparatus, comprising:
a memory; and
a processor configured to:
  receive a number of read commands;
  increment a read count by a first value in response to determining a first read command of the number of read commands in a block address is succeeded by a second read command of the number of read commands in the block address within a particular period of time;
  increment the read count by a second value in response to determining the first read command in the block address is succeeded by the second read command in the block address after the particular period of time; and
  increment the read count by a third value in response to determining the first read command in the block address is succeeded by a program command in the block address within the particular period of time.

10. The apparatus of claim 9, wherein the first value is less than the second value.

11. The apparatus of claim 9, wherein the third value is less than the second value.

12. The apparatus of claim 9, wherein the processor is further configured to initiate a read disturb scan in response to the incremented read count reaching a threshold.

13. The apparatus of claim 9, further comprising a read counter configured to record the read count.

14. A system, comprising:
a host; and
a memory coupled to the host, wherein the memory comprises:
  an array of memory cells; and
  a processor coupled to the array of memory cells, wherein the processor is configured to:
    increment a read count by a first value in response to receiving a number of sequential read commands from the host;
    increment the read count by a second value in response to receiving a random read command from the host; and
    initiate a read disturb scan in response to the incremented read count reaching a threshold.

15. The system of claim 14, wherein the host is configured to transmit a first command to the memory including the number of sequential read commands.

16. The system of claim 15, wherein the number of sequential read commands are for a first file.

17. The system of claim 16, wherein the first file is a media file.

18. The system of claim 15, wherein the host is configured to transmit a second command to the memory including the random read command.

19. The system of claim 18, wherein the random read command is for a second file, wherein a size of the second file is less than a size of the first file.

* * * * *